US007864595B2

(12) United States Patent
Bae

(10) Patent No.: US 7,864,595 B2
(45) Date of Patent: Jan. 4, 2011

(54) NONVOLATILE MEMORY CELL, NONVOLATILE MEMORY DEVICE, AND METHOD OF PROGRAMMING THE NONVOLATILE MEMORY DEVICE

(75) Inventor: Dong-Il Bae, Incheon (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 171 days.

(21) Appl. No.: 12/367,993

(22) Filed: Feb. 9, 2009

(65) Prior Publication Data

US 2010/0014358 A1  Jan. 21, 2010

(30) Foreign Application Priority Data

Jul. 18, 2008  (KR) ............... 10-2008-0070162

(51) Int. Cl.
  *G11C 11/34* (2006.01)
  *G11C 16/04* (2006.01)
(52) U.S. Cl. .................. 365/185.28; 365/185.18
(58) Field of Classification Search ............ 365/185.28, 365/185.17, 185.18
  See application file for complete search history.

(56) References Cited

U.S. PATENT DOCUMENTS 6,741,502 B1 * 5/2004 Cernea .................. 365/185.29
7,502,260 B2 * 3/2009 Li ........................ 365/185.12
2006/0041711 A1 2/2006 Miura et al.

FOREIGN PATENT DOCUMENTS

| JP | 05-299616 | 12/1993 |
|---|---|---|
| JP | 2004-102781 | 4/2004 |
| KR | 2003-0081131 | 10/2003 |

OTHER PUBLICATIONS

English language abstract of Japanese Publication No. 05-299616.
English language abstract of Japanese Publication No. 2004-102781.
English language abstract of Korean Publication No. 2003-0081131.

* cited by examiner

*Primary Examiner*—Anh Phung
(74) *Attorney, Agent, or Firm*—Muir Patent Consulting, PLLC

(57) ABSTRACT

A method of programming a nonvolatile memory device. The method may include pre-programming one memory cell among a plurality of memory cells by storing data in a first data storage layer using a first program voltage applied to one word line corresponding to the one memory cell among the plurality of memory cells; and while pre-programming other memory cells among the plurality of memory cells, background-programming the pre-programmed memory cell by moving the stored data to a second data storage layer using a second program voltage that is higher than the first program voltage applied to the word line of the pre-programmed memory cell.

20 Claims, 8 Drawing Sheets

NONVOLATILE MEMORY CELL, NONVOLATILE MEMORY DEVICE, AND METHOD OF PROGRAMMING THE NONVOLATILE MEMORY DEVICE

CROSS-REFERENCE TO RELATED APPLICATIONS

This application claims the benefit of Korean Patent Application No. 10-2008-0070162, filed on Jul. 18, 2008, in the Korean Intellectual Property Office, the disclosure of which is incorporated herein in its entirety by reference.

BACKGROUND

This application relates to a nonvolatile memory device, and more particularly, to a nonvolatile memory cell with a high speed write operation, a nonvolatile memory device, and a method of programming the nonvolatile memory device.

Semiconductor memory devices storing data may be roughly classified into volatile memory devices and nonvolatile memory devices. Volatile memory devices lose stored data when the supply of power is cut off whereas nonvolatile memory devices retain stored data even when the supply of power is cut off.

Examples of volatile memory devices include dynamic random access memories (DRAMs) and static random access memories (SRAMs). Examples of nonvolatile memory devices include flash memories and phase random access memories (PRAMs). DRAMs can read and write data in less than 100 ns, and SRAMs can read and write data in less than 50 ns. Although DRAMs are faster than SRAMs in terms of read and write operations, the DRAMs require periodic refreshing due to their volatility, thereby consuming a lot of power.

Flash memories can read data in less than 100 ns. But flash memories are generally slower than other types of memories in performing write operations. For example, NAND flash memories write data in less than 200 μs, and NOR flash memories write data in less than 10 μs. PRAMs can read data in less than 100 ns, but PRAMs write data in a time range between about 100 ns to 1 μs. Since flash memories are fast in a read operation but are slow in a write operation, a lot of time is taken to program the flash memories. However, flash memories do not require refreshing due to their nonvolatility.

SUMMARY

According to an aspect of the inventive concept, there is provided a method of programming a nonvolatile memory device that comprises a plurality of memory cells, each memory cell comprising first and second data storage layers, the method comprising: pre-programming one memory cell among the plurality of memory cells by storing data in the first data storage layer using a first program voltage applied to one word line corresponding to the one memory cell among the plurality of memory cells; and while pre-programming other memory cells among the plurality of memory cells, background-programming the pre-programmed memory cell by moving the stored data to the second data storage layer using a second program voltage that is higher than the first program voltage applied to the word line of the pre-programmed memory cell.

According to another aspect of the present invention, there is provided a nonvolatile memory cell comprising: a buried isolation layer formed on a wafer; a source and a drain formed on the buried isolation layer so as to be spaced apart from each other; a first data storage layer formed between the source and the drain; and a gate stack structure formed on the first data storage layer and comprising a tunneling insulating layer, a second data storage layer, a blocking insulating layer, and a gate electrode.

The first data storage layer may store data if a program voltage applied to the gate electrode is a first program voltage, and the second data storage layer may store data if a program voltage applied to the gate electrode is a second program voltage that is higher than the first program voltage.

The nonvolatile memory cell may further comprise a back gate electrode formed under the buried isolation layer.

The first data storage layer may generate holes due to ion ionization using the first program voltage, and store the generated holes. The second data storage layer may store the data stored in the first data storage layer through channel hot electron injection or FN tunneling using the second program voltage.

The second data storage layer may comprise a silicon nitride layer or a high-k dielectric layer having a dielectric constant that is higher than a predetermined value. The nonvolatile memory cell may further comprise at least one of a capacitor and a resistor connected to the source.

According to another aspect of the present invention, there is provided a nonvolatile memory device comprising: a memory core comprising a plurality of memory cells; and a driving unit driving the memory core, wherein the driving unit comprises: a data sensing unit sensing whether data is stored in each of the plurality of memory cells; a mode control unit generating a mode control signal controlling a program driving mode for each of the plurality of memory cells according to the sensing result of the data sensing unit; a voltage providing unit selectively providing a voltage to each of the plurality of memory cells according to the mode control signal; and a row decoder applying a voltage provided by the voltage providing unit to each of the plurality of memory cells.

Each of the plurality of memory cells may comprise: a buried isolation layer formed on a wafer; a source and a drain formed on the buried isolation layer so as to be spaced apart from each other; a first data storage layer formed between the source and the drain; and a gate stack structure formed on the first data storage layer and comprising a tunneling insulating layer, a second data storage layer, a blocking insulating layer, and a gate electrode.

According to another aspect of the inventive concept, there is provided a method of manufacturing a nonvolatile memory cell, the method comprising: forming a buried isolation layer on a wafer; forming a source and a drain on the buried isolation layer so as to be spaced apart from each other; forming a first data storage layer between the source region and the drain region; and a gate stack structure formed on the first data storage layer and comprising a tunneling insulating layer, a second data storage layer, a blocking insulating layer, and a gate electrode.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
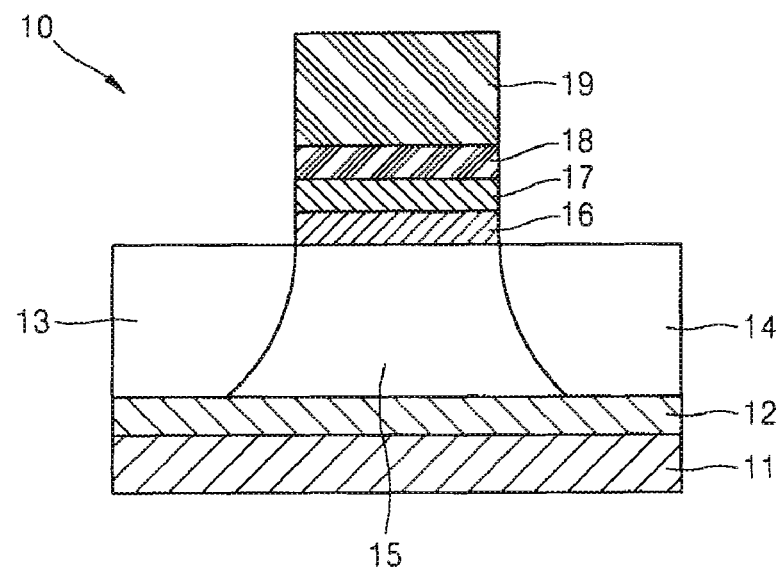
FIG. 1 is a cross-sectional view of a nonvolatile memory cell according to an embodiment of the inventive concept.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a nonvolatile memory cell 10 according to an embodiment of the inventive concept.

Referring to FIG. 1, the nonvolatile memory cell 10 includes a back gate 11, a buried isolation layer 12, a source 13, a drain 14, a first data storage layer 15, a tunneling insulating layer 16, a second data storage layer 17, a blocking insulating layer 18, and a front gate 19.

The nonvolatile memory cell 10 may operate as a one-transistor (1T) dynamic random access memory (DRAM) or a flash memory according to a program voltage applied to the front gate 19. Specifically, if the program voltage is a low voltage that is lower than a predetermined value, the nonvolatile memory cell 10 is pre-programmed at high speed in a similar way to that of a write operation of the 1T DRAM. Alternatively, if the program voltage is a high voltage that is higher than the predetermined value, the nonvolatile memory cell 10 may be background-programmed in a similar way to that of a write operation of the flash memory. The pre-programming and the background-programming will be explained later in more detail with reference to FIG. 3.

The 1T DRAM and the flash memory are set forth above as examples. In other embodiments, for example, if the program voltage is a low voltage, the nonvolatile memory cell 10 may be pre-programmed at high speed in a similar way to that of a write operation of the 1T DRAM, and if the program voltage is increased to a high voltage, the nonvolatile memory cell 10 may be background-programmed in a similar way to that of a write operation of a nonvolatile memory device, such as a ferroelectric random access memory (FRAM), a phase random access memory (PRAM), a magnetic random access memory (MRAM), or a nano floating gate memory (NFGM). Programming based on the write operation of the 1T DRAM and the flash memory will be explained. Also, the 1T DRAM may be realized as a silicon-on-insulator (SOI) type, a FinFET type, a silicon nano-wire type, or a vertical transistor type, among other possibilities.

A back gate bias voltage may be applied to the back gate 11 so that data, for example, charge carriers, stored in the first data storage layer 15 are not leaked. The buried isolation layer 12 may be formed on the back gate 11 and prevents the leakage of the data stored in the first data storage layer 15. The buried isolation layer 12 may include an oxide, an N-well, and SiC. The first data storage layer 15 may be formed of silicon, and in this case, the first data storage layer 15 and the buried isolation layer 12 may be an SOI. Also, the first data storage layer 15 may be a floating body.

The tunneling oxide layer 16 may be a silicon oxide layer and have a thickness of approximately 20 to 70 Å. The second data storage layer 17 may be a silicon nitride layer or a high-k dielectric layer having a dielectric constant that is higher than that of the silicon nitride layer. For example, the second data storage layer 17 may be a Si3N4 layer, a metal oxide layer, a metal nitride layer, or a combination thereof, and have a thickness of approximately 40 to 120 Å. The second data storage layer 17 may include a trap site in which charges passing through the tunneling oxide layer 16 are stored. The second data storage layer 17 may be a floating gate.

The blocking oxide layer 18 prevents the charges trapped in the trap site of the second data storage 17 from moving to the front gate 19, and charges of the front gate 19 from moving to the second data storage layer 17. If the second data storage layer 17 is formed of a nitride, the tunneling insulating layer 16, the second data storage layer 17, and the blocking insulating layer 18 may form an oxide-nitride-oxide (ONO) structure. The front gate 19 may be formed of at least one material selected from the group comprising TaN, TiN, W, WN, HfN, and tungsten silicide. The front gate 19 may be connected to a corresponding word line to which a program voltage is applied, and the drain 14 may be connected to a corresponding bit line.

Figure 2:
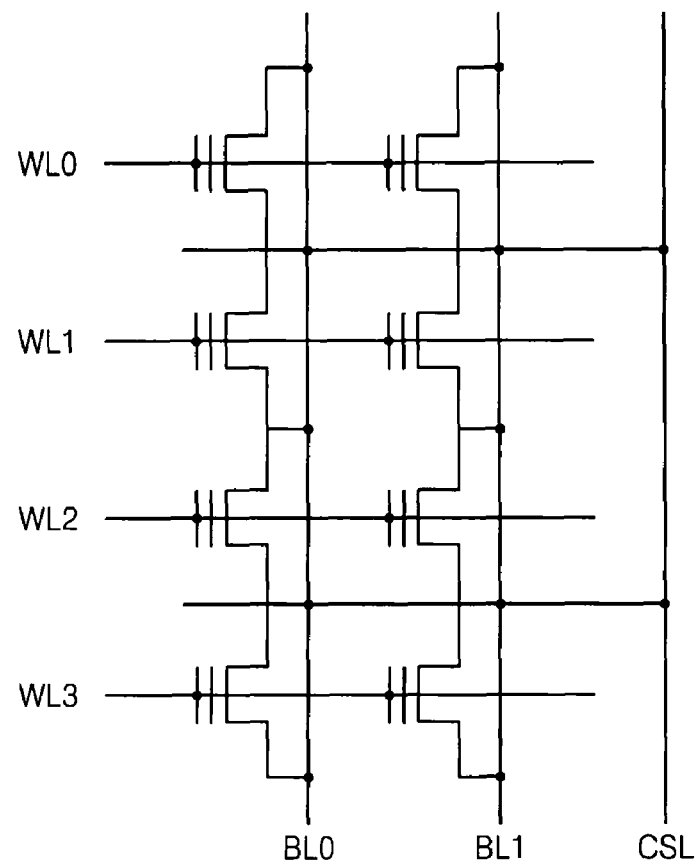
FIG. 2 is a circuit diagram of a memory device according to an embodiment of the inventive concept.

FIG. 2 is a circuit diagram of a nonvolatile memory device according to an embodiment of the inventive concept.

Referring to FIG. 2, the nonvolatile memory device includes a plurality of memory cell strings, and each of the plurality of memory cell strings includes a plurality of memory cells that are connected to one another. A front gate and a drain of each of the plurality of memory cells are connected to a word line and a bit line, respectively. Here, a voltage applied to the word line is referred to as a program voltage.

For convenience, although four word lines WL0, WL1, WL2, and WL3 and two bit lines BL0 and BL1 are illustrated in FIG. 2, it will be understood by one of ordinary skill in the art that the number of word lines and bit lines may vary.

Figure 3:
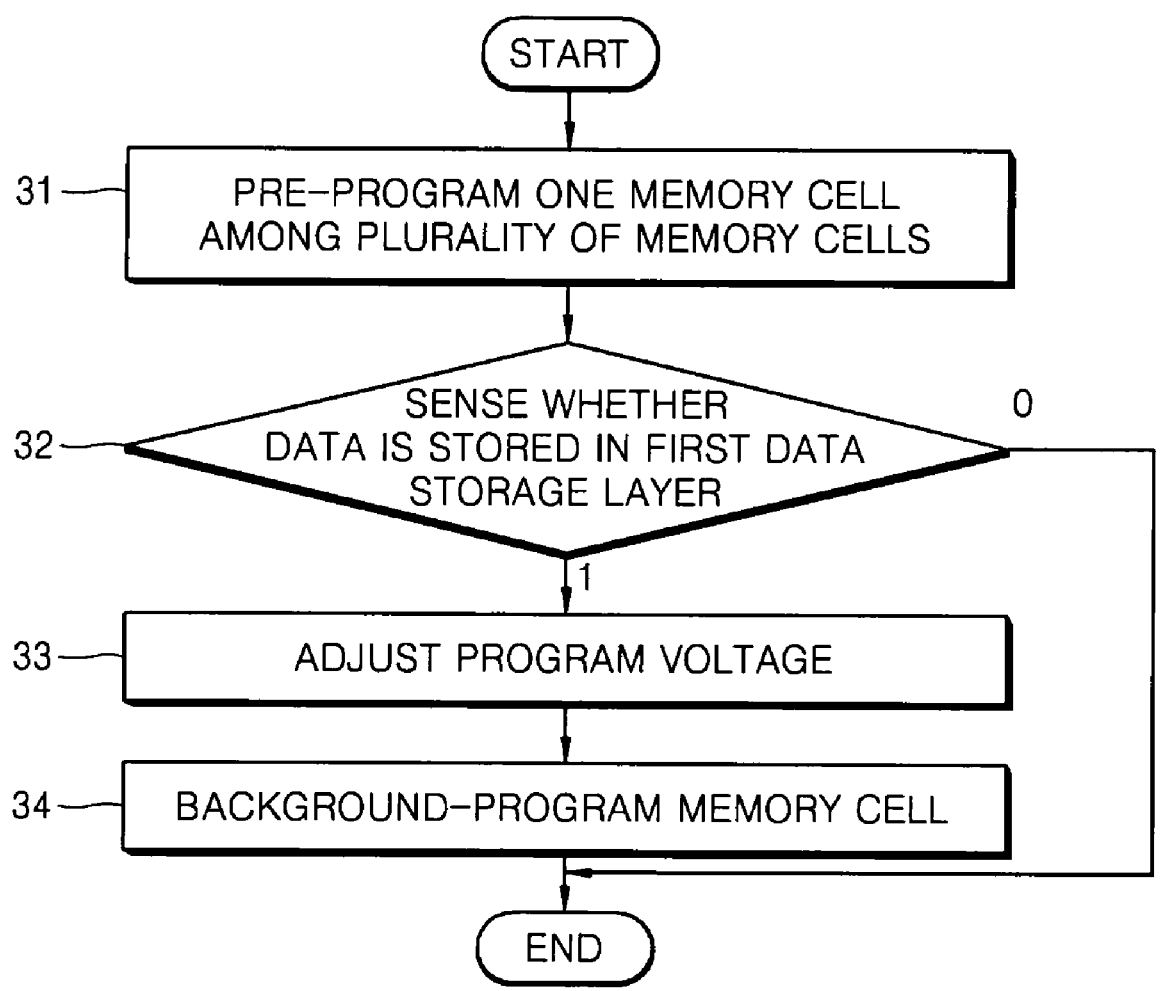
FIG. 3 is a flowchart illustrating a method of programming a memory device, according to an embodiment of the inventive concept.

FIG. 3 is a flowchart illustrating a method of programming a memory device, according to an embodiment of the inventive concept. Table 1 included below will be explained with reference to FIG. 3, and shows the program operation of a memory device according to a voltage applied to the memory device, according to an embodiment of the inventive concept.

TABLE 1

|  |  |  | $V_{FG}[V]$ | $V_D[V]$ | $V_{BG}[V]$ |
|---|---|---|---|---|---|
| 1T DRAM | Program | Impact Ionization | 1.5 | 3.5 | −40 |
|  |  | Gate Induced Drain Leakage | −4.0 | 3.5 | −40 |
|  |  | Erase | 1.5 | −3.0 | −40 |
|  |  | Read | 1.5 | 0.5 | −40 |
| Non-Volatile Memory | Program | Fowler-Nordheim | 8 | — | — |
|  |  | Channel Hot Electron Injection | 6 | 2 | — |
|  |  | Erase | −8 | — | — |
|  |  | Read | 1.5 | 0.5 | — |

In Table 1, $V_{FG}$ is a voltage applied to a front gate of each of a plurality of memory cells through a word line, $V_D$ is a voltage applied to a drain of the memory cell through a bit line, and $V_{BG}$ is a voltage applied to a back gate of the memory cell.

A method of programming a memory cell will now be explained with reference to FIG. 3 and Table 1. In operation 31 of FIG. 3, one memory cell among a plurality of memory cells is pre-programmed. Specifically, the one memory cell is pre-programmed by storing data in the first data storage layer 12 using a voltage applied to a word line of the one memory cell. Here, pre-programming is prior programming performed on a memory cell, and is based on a programming mechanism of a 1T DRAM. Also, pre-programming may also be referred to as buffer programming or 1T DRAM programming.

Figure 6:
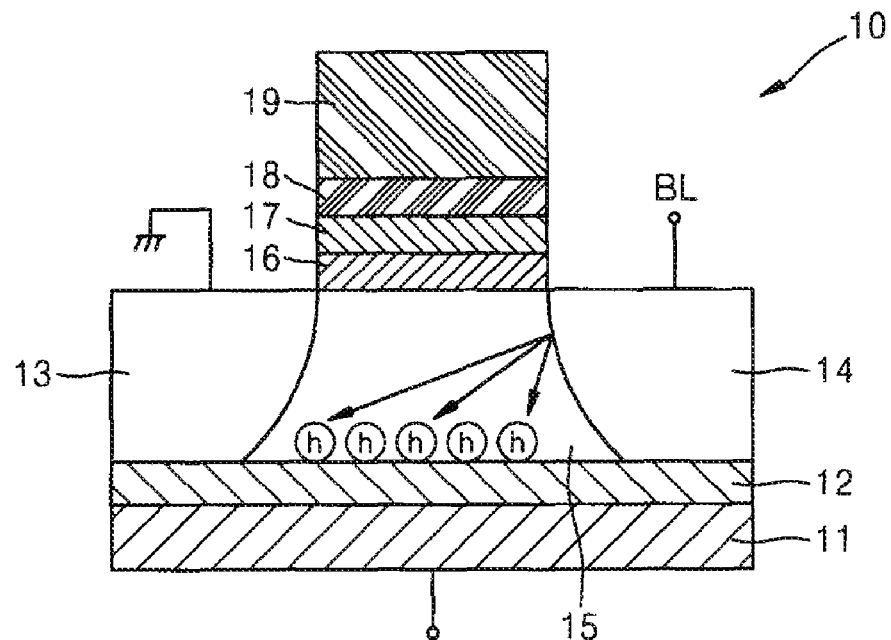
FIG. 6 is a cross-sectional view for explaining a pre-program operation performed on the nonvolatile memory cell of FIG. 1.

FIG. 6 is a cross-sectional view for explaining a pre-program operation performed on the memory cell of FIG. 1. The pre-program operation will now be explained with reference to Table 1 and FIGS. 3 and 6.

Once a first program voltage is applied to the front gate 19, the nonvolatile memory cell 10 may be pre-programmed in a similar manner to that of a write operation of a 1T DRAM. Here, the first program voltage is low enough to cause impact ionization at the front gate 19 and the drain 14, for example, a low voltage of approximately 1 to 3 V. A write operation can be performed at a high speed of less than approximately 10 ns due to the pre-programming. Accordingly, since data is stored in a floating body (i.e., the first storage layer 15) due to the pre-programming, a program operation can be performed at high speed.

In an embodiment, as shown in Table 1, if a voltage of 1.5 V is applied to the front gate 19 through the word line, a voltage of 3.5 V is applied to the drain 14 through the bit line, a voltage of −40 V is applied to the back gate 11, and the source 13 is grounded, the nonvolatile memory cell 10 is pre-programmed due to impact ionization. In more detail, under the aforesaid voltage conditions, holes are generated in the first data storage layer 15 due to the impact ionization, and the generated holes are accumulated in the first data storage layer 15. The buried isolation layer 12 isolates the first data storage layer 15 from the back gate 11 such that the generated holes are prevented from moving to the back gate 11. Also, as such a high voltage of approximately −40 V is applied to the back gate 11, the generated holes are accumulated in the first data storage layer 15.

In another embodiment, as shown in Table 1, if a voltage of −4.0 V is applied to the front gate 19 through the word line, a voltage of 3.5 V is applied to the drain 14 through the bit line, a voltage of −40 V is applied to the back gate 11, and the source 13 is grounded, the nonvolatile memory cell 10 is pre-programmed due to gate induced drain leakage (GIDL). Here, GIDL refers to current leakage between a drain and a substrate before the application of a breakdown voltage in a device using a thin gate oxide layer. Specifically, the drain 14 is deeply depleted by a field between the front gate 19 and the drain 14, bands are sharply bent, electrons exit a drain junction due to band-to-band tunneling, and electron-hole pairs (EHPs) are formed due to impact ionization, such that the electrons move to the drain 14 and holes move to the substrate, thereby resulting in current leakage. Even in this event, the electrons move to the drain 14 and the holes are accumulated in the first data storage layer 15.

In another embodiment, if a predetermined voltage is applied to the front gate 19, the drain 14, and the back gate 11, the nonvolatile memory cell 10 is pre-programmed due to PNP or NPN bipolar junction transistor (BJT) characteristics of the source 13, a channel, and the drain 14. For example, once current flows through the source 13, the channel, and the drain 14 by applying the predetermined voltage, a latchup may occur and the nonvolatile memory cell 10 may be pre-programmed using the latchup. Even in this case, since the electrons move to the drain 14 and the holes are accumulated in the first data storage layer 15, the nonvolatile memory cell 10 is programmed.

Referring to FIG. 3 again, in operation 32, it is sensed whether data is stored in the first data storage layer 15 of the nonvolatile memory cell 10. In more detail, it is sensed whether data is stored in the first data storage layer 15 by measuring a drain current of the nonvolatile memory cell 10. At this time, a sense amplifier may be used to sense whether data is stored in the first data storage layer 15.

Figure 7:
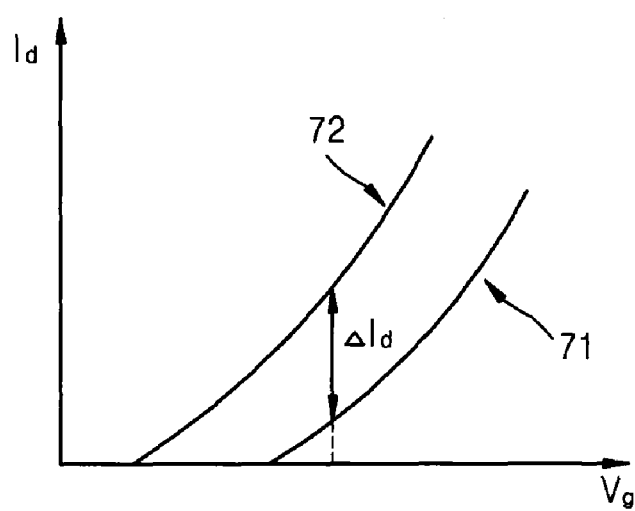
FIG. 7 is a graph illustrating a relationship between a gate voltage and a drain current during pre-programming, according to an embodiment of the inventive concept.

FIG. 7 is a graph illustrating a relationship between a gate voltage and a drain current during pre-programming, according to an embodiment of the inventive concept.

Referring to FIGS. 6 and 7, a gate voltage $V_g$ is a voltage applied to the front gate 19, and a drain current $I_d$ is a current flowing through the drain 14. Curve 71 represents an initial state or an erase state where data is not stored, and curve 72 represents a pre-programmed state where data is stored. If data is stored, the drain current $I_d$ is increased by $\Delta I_d$ when the same gate voltage $V_g$ is used.

Accordingly, if it is sensed that the drain current $I_d$ is higher than a predetermined value, it is determined that the nonvolatile memory cell 10 is pre-programmed and the method proceeds to operation 33. If it is sensed that the drain current $I_d$ is not higher than the predetermined value, it is determined that the nonvolatile memory cell 10 is not pre-programmed and the method ends.

Referring to FIG. 3 again, in operation 33, if it is sensed that the drain current $I_d$ is higher than the predetermined value and it is determined that the nonvolatile memory cell 10 is pre-programmed, a program voltage applied to the nonvolatile memory cell 10 is adjusted. In more detail, the program voltage is boosted so as to program the nonvolatile memory cell 10, which is pre-programmed at high speed in a similar way to that of a write operation of a 1T DRAM, in a similar way to that of a write operation of a flash memory.

In operation 34, while other memory cells among the plurality of memory cells are pre-programmed, the pre-programmed nonvolatile memory cell 10 is background-programmed using the adjusted program voltage. Here, background-programming is subsequent programming performed on a pre-programmed memory cell. In an embodiment, background-programming is based on a programming mechanism of a flash memory. Background-programming may also be referred to as flash memory programming or nonvolatile programming.

Figure 4:
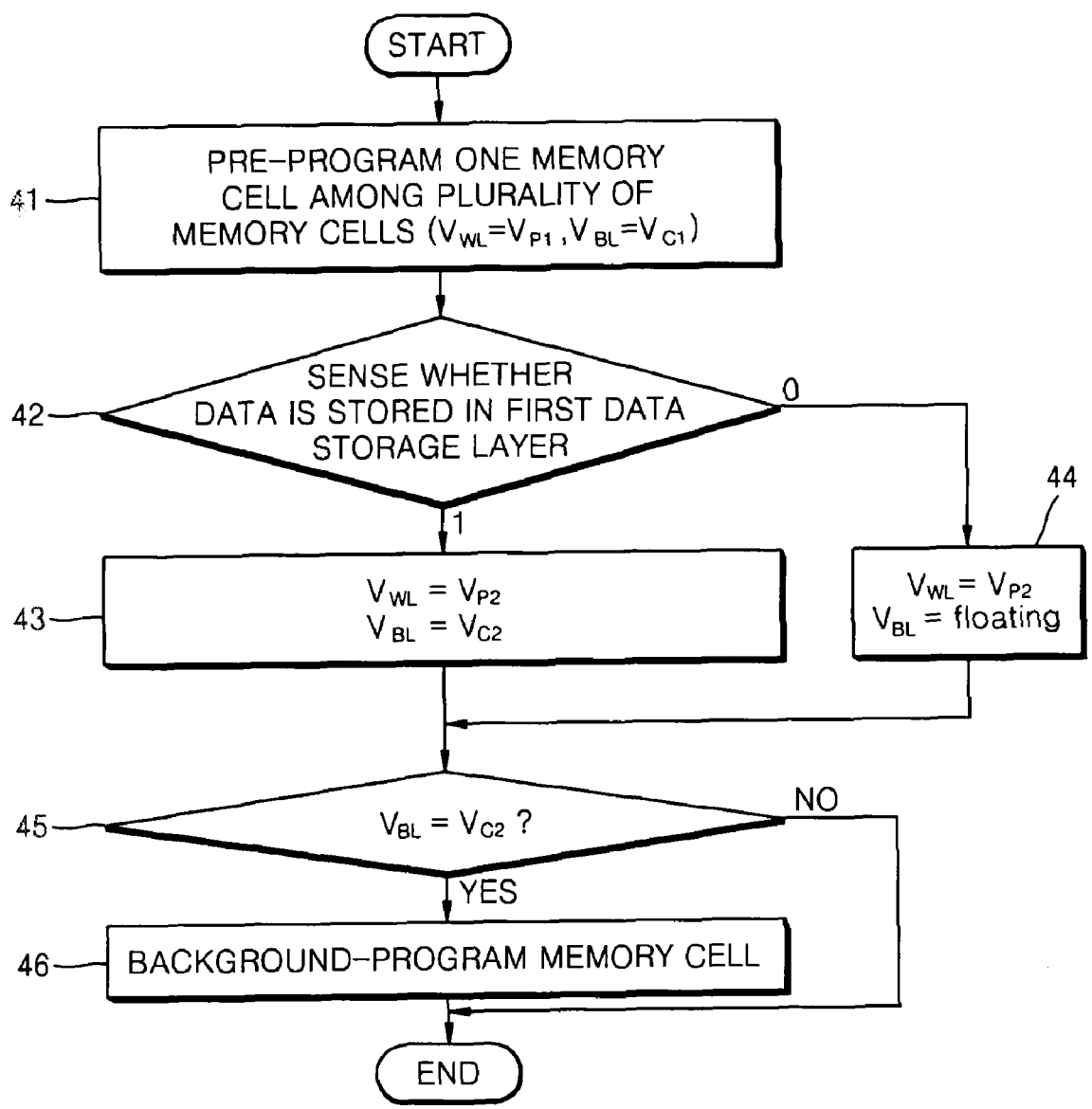
FIG. 4 is a detailed flowchart illustrating a method of programming a memory device, according to an embodiment of the inventive concept.

FIG. 4 is a detailed flowchart illustrating a method of programming a memory device, according to an embodiment of the inventive concept.

Referring to FIG. 4, in operation 41, one memory cell 10 among a plurality of memory cells is pre-programmed. At this time, a word line voltage $V_{WL}$ applied to the front gate 19 is a first program voltage $V_{P1}$, and a bit line voltage $V_{BL}$ applied to the drain 14 is a first voltage $V_{C1}$. As shown in Table 1, the first program voltage $V_{P1}$ may be, for example, 1.5 V and the first voltage $V_{C1}$ may be, for example, 3.5 V.

In operation 42, it is sensed whether data is stored in the first data storage layer 15 of the nonvolatile memory cell 10. If it is sensed that data is stored in the nonvolatile memory cell 10, the method proceeds to operation 43, and if it is sensed that no data is stored in the nonvolatile memory cell 10, the method proceeds to operation 44.

In operation 43, the word line voltage $V_{WL}$ applied to the nonvolatile memory cell 10 is changed from the first program voltage $V_{P1}$ to a second program voltage $V_{P2}$, and the bit line voltage $V_{BL}$ is changed from the first voltage $V_{C1}$ to a second voltage $V_{C2}$. In this case, the second voltage $V_{C2}$ is applied to the bit line, thereby making it possible to program the nonvolatile memory cell 10. As shown in Table 1, the second program voltage $V_{P2}$ may be, for example, 6 V and the second voltage $V_{C2}$ may be, for example, 2 V.

In operation 44, the word line voltage $V_{WL}$ applied to the nonvolatile memory cell 10 is changed from the first program voltage $V_{P1}$ to the second program voltage $V_{P2}$ and the bit line voltage $V_{BL}$ may be floated. In this case, a voltage of 0 V may be applied to the bit line so that the nonvolatile memory cell 10 is not background-programmed, and then a power voltage VCC may be applied and the bit line voltage $V_{BL}$ may be floated.

In operation 45, it is determined whether the bit line voltage $V_{BL}$ applied to the nonvolatile memory cell 10 is the second voltage $V_{C2}$. The word line voltage $V_{WL}$ applied to the nonvolatile memory cell 10 in both operations 43 and 44 may be changed to the second program voltage $V_{P2}$. Accordingly, whether to background-program the nonvolatile memory cell 10 is determined depending on the bit line voltage $V_{BL}$. If it is determined that the bit line voltage $V_{BL}$ is the second voltage $V_{C2}$, the method proceeds to operation 46. Conversely, if it is determined that the bit line voltage $V_{BL}$ is not the second voltage $V_{C2}$, the method ends.

In operation 46, while other memory cells among the plurality of memory cells are pre-programmed, the pre-programmed nonvolatile memory cell 10 is background-programmed due to channel hot electron injection (CHEI). In this case, as shown in Table 1, the second program voltage $V_{P2}$ applied to the front gate 19 may be 6 V and the second voltage $V_{C2}$ applied to the drain 14 may be 2 V.

Figure 5:
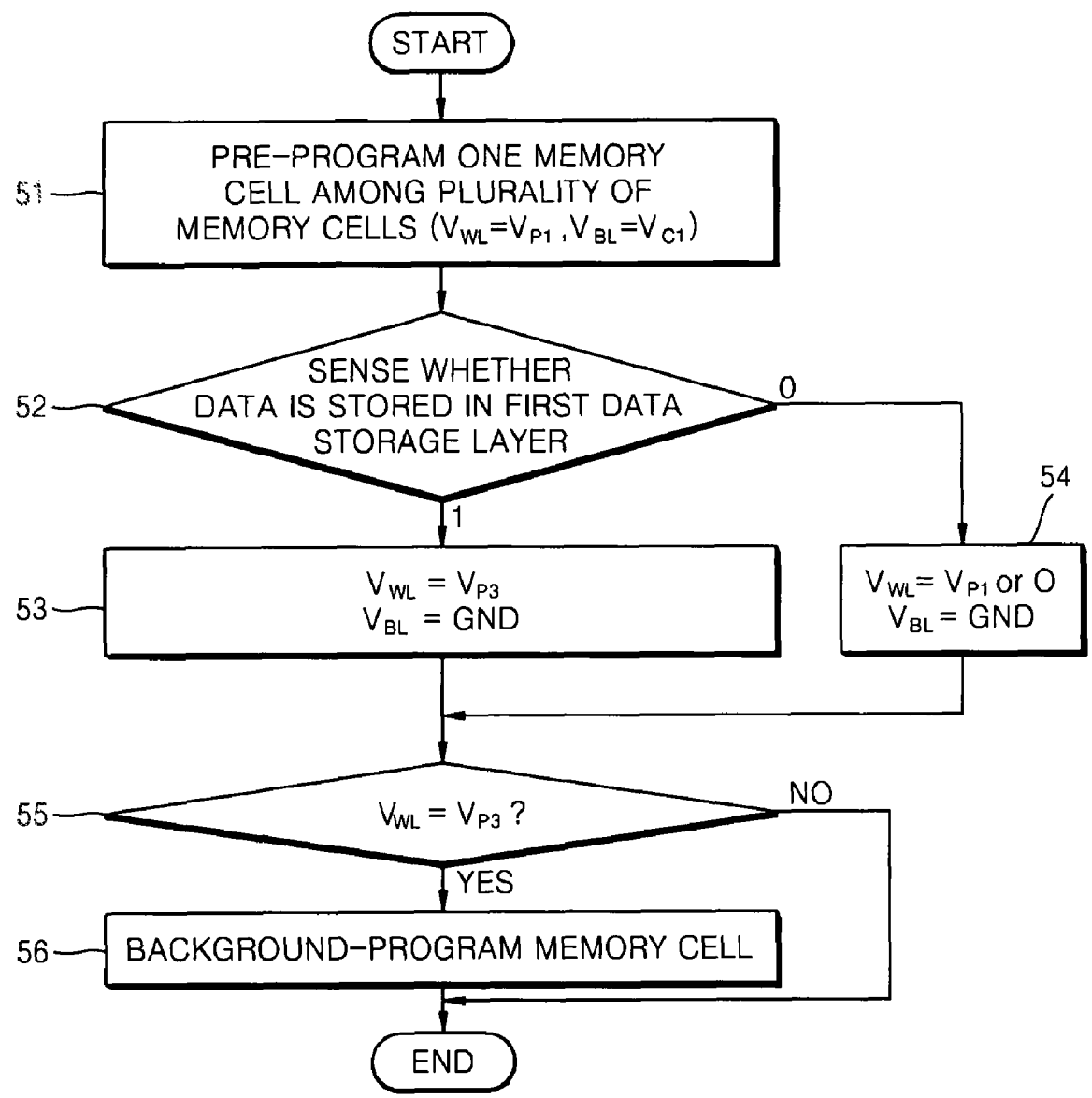
FIG. 5 is a detailed flowchart illustrating a method of programming a memory device, according to another embodiment of the inventive concept.

FIG. 5 is a detailed flowchart illustrating a method of programming a memory device, according to another embodiment of the inventive concept.

Referring to FIG. 5, in operation 51, one memory cell 10 among a plurality of memory cells is pre-programmed. At this time, a word line voltage $V_{WL}$ applied to the front gate 19 is a first program voltage $V_{P1}$ and a bit line voltage $V_{BL}$ applied to the drain 14 is a first voltage $V_{C1}$. As shown in Table 1, the first program voltage $V_{P1}$ may be, for example, 1.5 V and the first voltage $V_{C1}$ may be, for example, 3.5 V.

In operation 52, it is sensed whether data is stored in the first data storage layer 15 of the nonvolatile memory cell 10. If it is sensed that data is stored in the nonvolatile memory cell 10, the method proceeds to operation 53. Conversely, if it is sensed that no data is stored in the nonvolatile memory cell 10, the method proceeds to operation 54.

In operation 53, the word line voltage $V_{WL}$ applied to the nonvolatile memory cell 10 is changed from the first program voltage $V_{P1}$ to a third program voltage $V_{P3}$, and the bit line voltage $V_{BL}$ is grounded. As shown in Table 1, the third program voltage $V_{P3}$ may be, for example, 8 V. The word line voltage $V_{WL}$ applied to the nonvolatile memory cell 10 of FIG. 5 is higher than the word line voltage $V_{WL}$ applied to the nonvolatile memory cell of FIG. 4, which is background-programmed using CHEI.

In operation 54, the word line voltage $V_{WL}$ applied to the nonvolatile memory cell 10 is fixed to the first program voltage $V_{P1}$ or is changed to 0 V, and the bit line voltage $V_{BL}$ is grounded.

In operation 55, it is determined whether the word line voltage $V_{WL}$ applied to the nonvolatile memory cell 10 is the third voltage $V_{P3}$. Since the bit line voltage $V_{BL}$ is grounded in both operations 53 and 54, whether to background-program the nonvolatile memory cell 10 is determined depending on the word line voltage $V_{WL}$. If it is determined that the word line voltage $V_{WL}$ is the third program voltage $V_{P3}$, the method proceeds to operation 56, and if it is determined that the word line voltage $V_{WL}$ is not the third program voltage $V_{P3}$, the method ends.

In operation 56, while other memory cells among the plurality of memory cells are pre-programmed, the pre-programmed memory cell 10 is background-programmed due to Fowler-Nordheim (FN) tunneling. In this case, as shown in Table 1, the third program voltage $V_{P3}$ applied to the front gate 19 may be 8 V.

Figure 8:
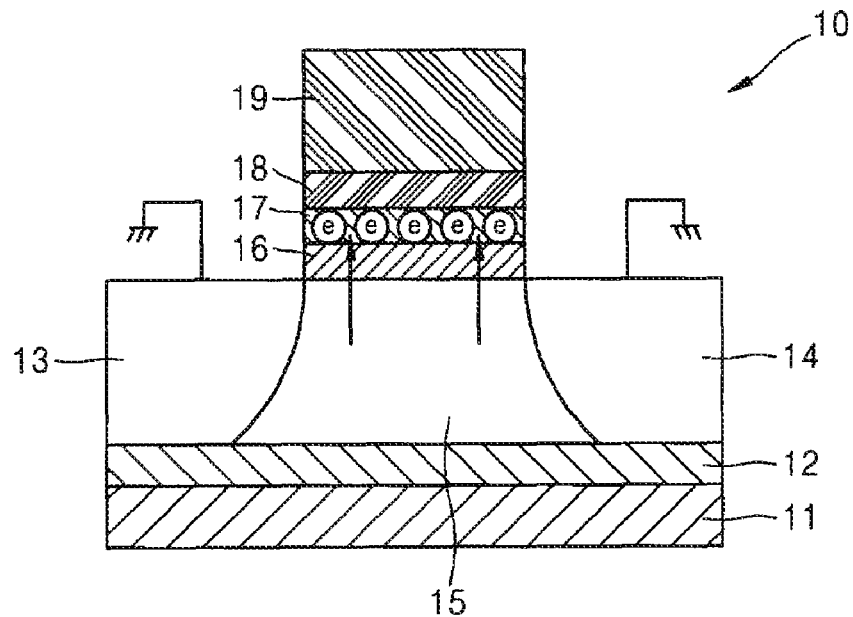
FIG. 8 is a cross-sectional view for explaining a background-program operation performed on the nonvolatile memory cell of FIG. 1.

FIG. 8 is a cross-sectional view for explaining a background-program operation performed on the nonvolatile memory cell 10 of FIG. 1. The background-program operation will now be explained with reference to FIGS. 5 and 8.

Once a third program voltage $V_{P3}$ is applied to the front gate 19, the nonvolatile memory cell 10 is background-programmed in a similar way to that in a write operation of a flash memory. Here, the third program voltage $V_{P3}$ is high enough to generate tunneling between the front gate 19 and the drain 14, for example, a high voltage of approximately 8 V. A time taken to perform a write operation by background-programming is longer than approximately 10 μs. Accordingly, although a write operation by background-programming is longer than a write operation by pre-programming, since data is stored in the floating gate that is the second data storage layer 17 due to the background-programming, the nonvolatile memory cell 10 can have nonvolatility to retain data even when the supply of power is cut off.

As shown in Table 1, if a third program voltage $V_{P3}$ of 8 V is applied to the front gate 19 through the word line and the source 13 and the drain 14 are grounded, the pre-programmed memory cell 10 is background-programmed due to FN tunneling. In more detail, under the aforesaid voltage conditions, electrons are delivered to the second data storage layer 17, thereby making it possible to background-program the nonvolatile memory cell 10.

Figure 9:
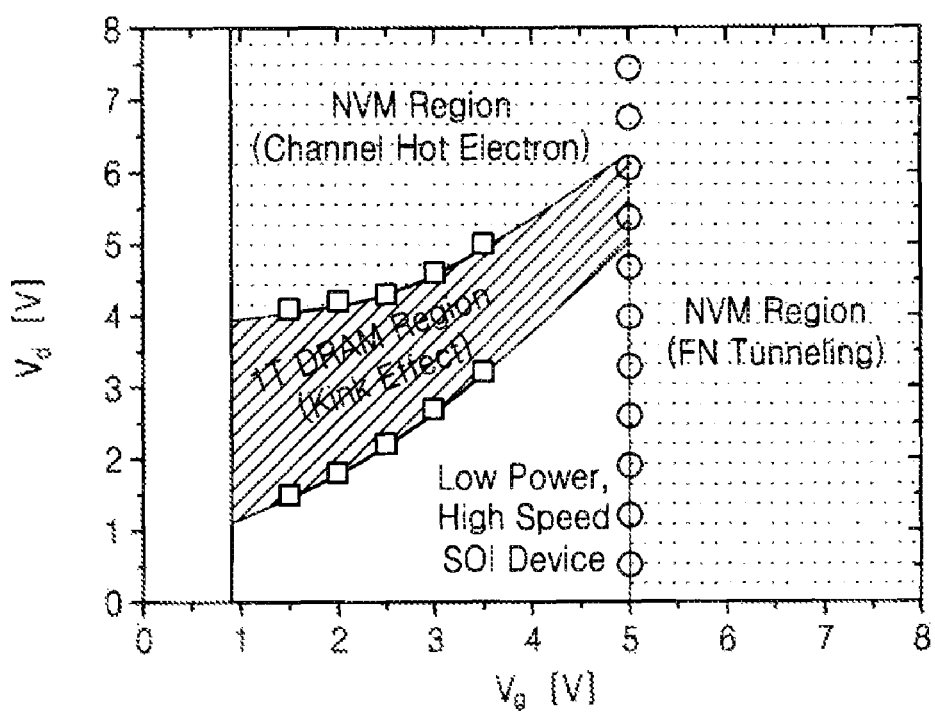
FIG. 9 is a graph illustrating the operation of the nonvolatile memory cell of FIG. 1 according to a voltage applied to a front gate of the nonvolatile memory cell.

FIG. 9 is a graph illustrating the operation of the nonvolatile memory cell 10 of FIG. 1 according to a voltage applied to the front gate 19 of the nonvolatile memory cell 10.

Referring to FIGS. 1 and 9, the horizontal axis represents a gate voltage $V_g$ (V) and the vertical axis represents a drain voltage $V_d$ (V). If the gate voltage $V_g$ is less than 5 V and the drain voltage $V_d$ is also low, the nonvolatile memory cell 10 operates as a low power high speed SOI. If the gate voltage $V_g$ is less than 5 V and the drain voltage $V_d$ ranges from 1 to 4 V, the nonvolatile memory cell 10 operates as a 1T DRAM due to kink effect that is also known as floating body effect. If the gate voltage $V_g$ is less than 5 V and the drain voltage $V_d$ is higher than 4 V, the nonvolatile memory cell 10 operates as a nonvolatile memory due to CHEI. If the gate voltage $V_g$ is higher than 5 V, the nonvolatile memory cell 10 operates as a nonvolatile memory due to FN tunneling irrespective of the drain voltage $V_d$.

Accordingly, in an embodiment, after the nonvolatile memory cell 10 is pre-programmed in a similar way to that of a 1T DRAM with a low gate voltage $V_g$ and a low drain voltage $V_d$ in order to perform a write operation at high speed, the nonvolatile memory cell 10 may be background-programmed in a similar way to that of a nonvolatile memory, such as a flash memory, using CHEI or FN tunneling by increasing the drain voltage $V_d$ or the gate voltage $V_g$. Accordingly, data does not need to be recalled from or restored to the flash memory whenever the power supply is turned on or off, FIG. 10 is a block diagram of a nonvolatile memory device 100 including the nonvolatile memory cell 10 of FIG. 1.

Figure 10:
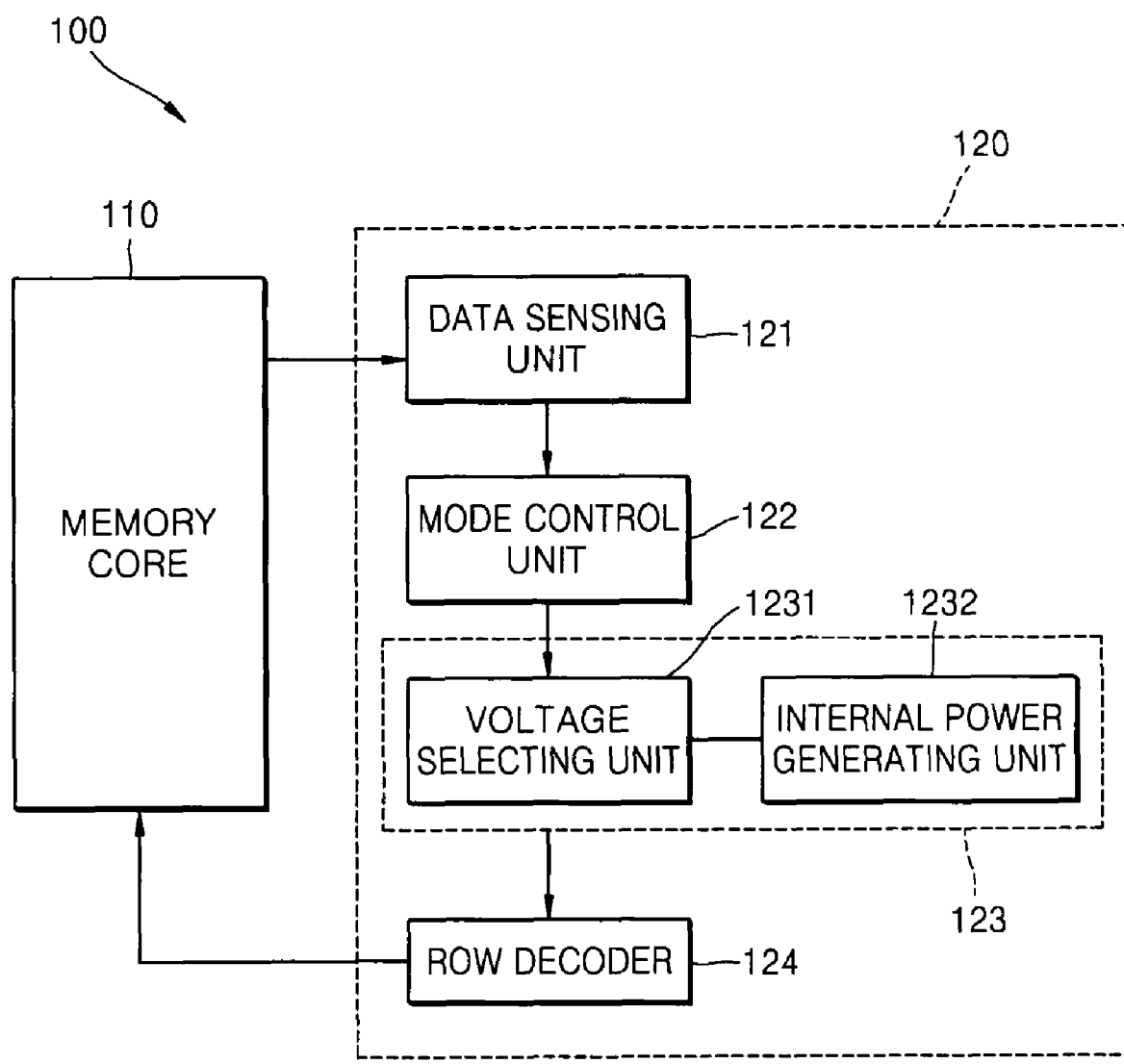
FIG. 10 is a block diagram of a nonvolatile memory device including the nonvolatile memory cell of FIG. 1.

Referring to FIG. 10, the nonvolatile memory device 100 may include a memory core 110 and a driving unit 120. The driving unit 120 may include a data sensing unit 121, a mode control unit 122, a voltage providing unit 123, and a row decoder 124. The voltage providing unit 123 may include a voltage selecting unit 1231 and an internal power generating unit 1232.

The memory core 110 may include a plurality of memory cells. Here, each of the memory cells is the nonvolatile memory cell 10 of FIG. 1. That is, each of the memory cells includes the buried isolation layer 12 formed on the wafer, the source 13 and the drain 14 formed on the buried isolation layer 12 to be spaced apart from each other, the first data storage layer 15 formed between the source 13 and the drain 14, and the gate stack structure formed on the first data storage layer 15 and including the tunneling insulating layer 16, the second data storage layer 17, the blocking insulating layer 18, and the gate electrode 19.

The driving unit 120 drives the memory core 110. The data sensing unit 121 senses data stored in each of the plurality of memory cells. The mode control unit 122 generates a mode control signal controlling a program driving mode of each of the plurality of memory cells according to the sensing result. The voltage providing unit 123 selectively provides a voltage to each of the plurality of memory cells according to the mode control signal. Further, the internal power generating unit 1232 receives external power and generates a plurality of internal voltages, and the voltage selecting unit 1231 selects and provides an appropriate voltage among the plurality of internal voltages according to the mode control signal. The row decoder 124 performs row decoding and applies a voltage provided by the voltage providing unit 123 to each of the plurality of memory cells.

Figure 11:
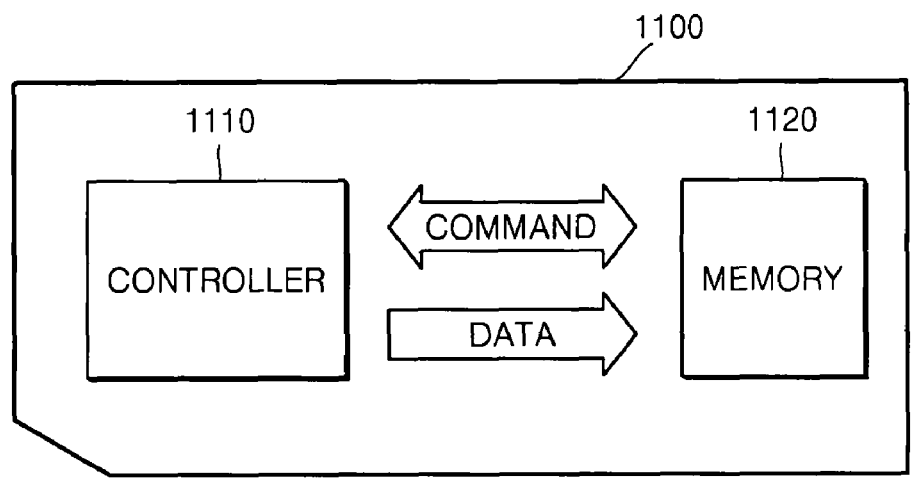
FIG. 11 is a block diagram illustrating a card according to an embodiment of the inventive concept.

FIG. 11 is a block diagram illustrating a card 1100 according to an embodiment of the inventive concept. Referring to FIG. 11, a controller 1110 and a memory 1120 of the card 1100 may be disposed to exchange an electrical signal therebetween. For example, when the controller 1110 gives a command, the memory 1120 may transmit data. The memory 1120 may include the nonvolatile memory device 100 of FIG.

10. The card 1100 may be any of various cards such as a memory stick card, a smart media (SM) card, a secure digital (SD) card, a mini SD card, and a multimedia card (MMC), among other possibilities.

Figure 12:
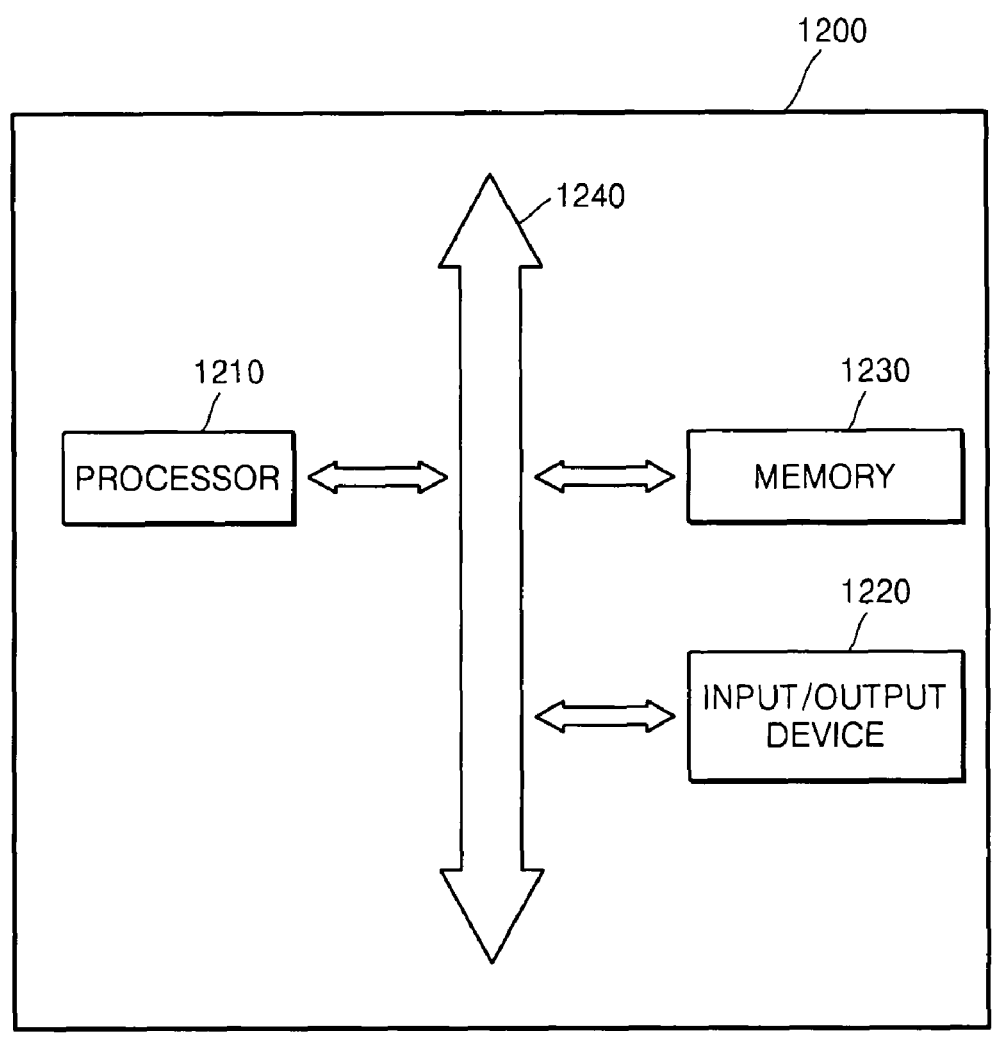
FIG. 12 is a block diagram illustrating a system according to an embodiment of the inventive concept.

FIG. 12 is a block diagram illustrating a system 1200 according to an embodiment of the inventive concept. Referring to FIG. 12, a processor 1210, an input/output device 1220, and a memory 1230 included in the system 1200 may communicate data therebetween by using a bus 1240. The processor 1210 may execute a program and control the system 1200. The input/output device 1220 may input or output data of the system 1200. The system 1200 may be connected to an external device, such as a personal computer (PC) or a network, by using the input/output device 1220 to exchange data with the external device. The memory 1230 may include the nonvolatile memory device 100 of FIG. 10. For example, the memory 1230 may store a code and data for the operation of the processor 1210. For example, the system 1200 may be used for a mobile phone, an MP3 player, a navigation system, a portable multimedia player (PMP), a solid state disk (SSD), a household appliance, and so on.

The inventive concept may be embodied as computer-readable codes on a computer-readable recording medium. The computer-readable recording medium is any data storage device that can store data which can be thereafter read by a computer system. Examples of the computer-readable recording medium include read-only memories (ROMs), random-access memories (RAMs), compact disk (CD)-ROMs, magnetic tapes, floppy disks, optical data storage devices, and carrier waves (such as data transmission through the Internet). The computer-readable recording medium can also be distributed over network coupled computer systems so that the compute readable code is stored and executed in a distributed fashion. Here, the program or code stored in the storage medium is a series of instructions directly or indirectly used in a device having an information processing ability, such as a computer, in order to obtain a specific result. Accordingly, the term "computer", irrespective of the real used of the term, refers to any device including a memory, an input/output device, and a calculation device, and having an information processing ability to perform a specific function.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

The invention claimed is:

1. A method of programming a nonvolatile memory device that comprises a plurality of memory cells, each memory cell comprising first and second data storage layers, the method comprising:

pre-programming one memory cell among the plurality of memory cells by storing data in the first data storage layer using a first program voltage applied to one word line corresponding to the one memory cell among the plurality of memory cells; and while pre-programming other memory cells among the plurality of memory cells, background-programming the pre-programmed memory cell by moving the stored data to the second data storage layer using a second program voltage that is higher than the first program voltage applied to the word line of the pre-programmed memory cell.

2. The method of claim 1, wherein pre-programming of the one memory cell comprises:

generating holes due to impact ionization using the first program voltage applied to the one memory cell among the plurality of memory cells; and pre-programming the one memory cell by storing the generated holes in the first data storage layer.

3. The method of claim 2, wherein the first data storage layer is a floating body.

4. The method of claim 1, wherein background-programming of the pre-programmed memory cell comprises:

sensing whether the data is stored in the pre-programmed memory cell;

adjusting voltages applied to the word line and a bit line of the pre-programmed memory cell according to a result of the sensing; and background-programming the pre-programmed memory cell by moving the data to the second data storage layer responsive to the adjusted voltages.

5. The method of claim 4, wherein adjusting of the voltages applied to the word line and the bit line of the pre-programmed memory cell according to the result of the sensing comprises:

changing the voltage applied to the word line to the second program voltage;

changing the voltage applied to the bit line to a predetermined voltage responsive to sensing that the data is stored in the first data storage layer; and floating the voltage applied to the bit line responsive to sensing that the data is not stored in the first data storage layer.

6. The method of claim 5, wherein background-programming of the pre-programmed memory cell by moving the data to the second data storage layer responsive to the adjusted voltages comprises:

moving the data to the second storage layer through channel hot electron injection using the second program voltage and the predetermined voltage when the voltage applied to the bit line is the predetermined voltage.

7. The method of claim 4, wherein adjusting of the voltages applied to the word line and the bit line of the pre-programmed memory cell according to the result of the sensing comprises:

changing the voltage applied to the word line to the second program voltage and grounding the voltage applied to the bit line responsive to sensing that the data is stored in the first data storage; and floating or changing the voltage applied to the word line to the first program voltage and grounding the voltage applied to the bit line responsive to sensing that the data is not stored in the first data storage layer.

8. The method of claim 7, wherein background-programming of the pre-programmed memory cell by moving the data to the second data storage layer responsive to the adjusted voltages comprises:

moving the data through Fowler-Nordheim (FN) tunneling to the second storage layer using the second program voltage when the voltage applied to the word line is the second program voltage.

9. The method of claim 4, wherein the second data storage layer is a floating gate.

10. The method of claim 1, wherein the first program voltage ranges from about 1 to 3 V, and the second program voltage is equal to or higher than about 6 V.

11. The method of claim 1, wherein pre-programming is performed based on a programming mechanism of one-transistor dynamic random access memory (1T DRAM), and the background-programming is performed based on a programming mechanism of a flash memory.

12. A method of programming a nonvolatile memory device that comprises a plurality of memory cells, each memory cell comprising first and second data storage layers, the method comprising:
applying a first program voltage to a word line corresponding to one memory cell of the plurality of memory cells;
applying a first predetermined voltage to a bit line corresponding to the one memory cell of the plurality of memory cells;
pre-programming the one memory cell responsive to applying the first program voltage and the first predetermined voltage;
sensing whether data is stored in the first data storage layer of the pre-programmed memory cell;
applying one of (a) a second program voltage and (b) a third program voltage to the word line corresponding to the pre-programmed memory cell responsive to the sensing; and
background-programming the pre-programmed memory cell by moving any stored data from the first data storage layer to the second data storage layer while pre-programming other memory cells among the plurality of memory cells.

13. The method of claim 12, wherein:
after sensing that the data is stored in the first data storage layer, applying the second program voltage to the word line corresponding to the pre-programmed memory cell and applying a second predetermined voltage to the bit line corresponding to the pre-programmed memory cell; and
after sensing that the data is not stored in the first data storage layer, applying the second program voltage to the word line corresponding to the pre-programmed memory cell and floating the bit line corresponding to the pre-programmed memory cell.

14. The method of claim 13, further comprising:
determining whether a voltage of the bit line corresponds to the second predetermined voltage; and
performing the background-programming of the pre-programmed memory cell through channel hot electron injection responsive to the determining.

15. The method of claim 13, wherein the second program voltage is higher than the first program voltage.

16. The method of claim 12, wherein:
after sensing that the data is stored in the first data storage layer, applying the third program voltage to the word line corresponding to the pre-programmed memory cell and applying a ground voltage to the bit line corresponding to the pre-programmed memory cell; and
after sensing that the data is not stored in the first data storage layer, applying one of (a) the first program voltage and (b) 0 Volts to the word line corresponding to the pre-programmed memory cell and applying a ground voltage to the bit line corresponding to the pre-programmed memory cell.

17. The method of claim 16, further comprising:
determining whether a voltage of the word line corresponds to the third program voltage; and
performing the background-programming of the pre-programmed memory cell through Fowler-Nordheim (FN) tunneling responsive to the determining.

18. The method of claim 16, wherein the third program voltage is higher than the first program voltage.

19. The method of claim 16, wherein the third program voltage is higher than the second program voltage.

20. A method of programming a nonvolatile memory device that comprises a plurality of memory cells, each memory cell comprising first and second data storage layers, the method comprising:
applying a first program voltage to a word line corresponding to one memory cell of the plurality of memory cells;
pre-programming the one memory cell responsive to applying the first program voltage;
sensing whether data is stored in the first data storage layer of the pre-programmed memory cell; and
background-programming the pre-programmed memory cell by moving any stored data from the first data storage layer to the second data storage layer while pre-programming other memory cells among the plurality of memory cells.

* * * * *